United States Patent
Chung et al.

(10) Patent No.: US 7,592,709 B2
(45) Date of Patent: Sep. 22, 2009

(54) BOARD ON CHIP PACKAGE AND METHOD OF MANUFACTURING THE SAME

(75) Inventors: Hyun-soo Chung, Hwaseong-si (KR); Dong-hyeon Jang, Suwon-si (KR); Dong-ho Lee, Seongnam-si (KR); In-young Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 260 days.

(21) Appl. No.: 11/430,900

(22) Filed: May 10, 2006

(65) Prior Publication Data

US 2007/0096341 A1     May 3, 2007

(30) Foreign Application Priority Data

Oct. 27, 2005   (KR) ...................... 10-2005-0101754

(51) Int. Cl.
  *H01L 23/48*   (2006.01)
  *H01L 29/40*   (2006.01)
  *H01L 23/28*   (2006.01)
(52) U.S. Cl. ...................... 257/784; 257/686
(58) Field of Classification Search ................. 257/666, 257/686, 784, 782, 783; 438/107, 109, 110, 438/113, 125
See application file for complete search history.

(56) References Cited

U.S. PATENT DOCUMENTS

| | | | | |
|---|---|---|---|---|
| 7,276,786 B2* | 10/2007 | Cho et al. | ................... | 257/686 |
| 7,291,925 B2* | 11/2007 | Han et al. | ................... | 257/777 |
| 2003/0102546 A1* | 6/2003 | Lee et al. | ................... | 257/686 |
| 2004/0145040 A1* | 7/2004 | Fukuda et al. | ............... | 257/687 |
| 2005/0059188 A1* | 3/2005 | Bolken et al. | ............... | 438/106 |
| 2005/0253241 A1* | 11/2005 | Hall | ........................... | 257/686 |
| 2006/0102996 A1* | 5/2006 | Han et al. | ................... | 257/686 |
| 2007/0040261 A1* | 2/2007 | Hetzel et al. | ................ | 257/686 |

FOREIGN PATENT DOCUMENTS

| | | |
|---|---|---|
| JP | 2001-085609 | 3/2001 |
| JP | 2003-133478 | 5/2003 |
| KR | 1020030045224 A | 6/2003 |

* cited by examiner

*Primary Examiner*—S. V Clark
(74) *Attorney, Agent, or Firm*—Harness, Dickey & Pierce

(57) ABSTRACT

A ball grid array type board on chip package may include an integrated circuit chip having an active surface that supports a plurality of contact pads. An interposer may be adhered to the active surface of the integrated circuit chip. At least one hole may be provided through the interposer to expose the contact pads. A board, which may have a first surface supporting a plurality of metal lines, may have a second surface adhered to the interposer. The board may have an opening through which the contact pads may be exposed. A plurality of bonding wires may connect the contact pads to the metal lines through the opening.

15 Claims, 7 Drawing Sheets

BOARD ON CHIP PACKAGE AND METHOD OF MANUFACTURING THE SAME

PRIORITY STATEMENT

This application claims the benefit of Korean Patent Application No. 10-2005-0101754, filed on Oct. 27, 2005, in the Korean Intellectual Property Office, the disclosure of which is incorporated herein in its entirety by reference.

BACKGROUND

1. Field of the Invention

Example embodiments of the present invention relate to an integrated circuit (IC) package, and more particularly, to a ball grid array type board on chip package and a method of manufacturing the same.

2. Description of the Related Art

A ball grid array type board on chip package may include an integrated circuit (IC) chip, which may be wire-bonded to a board through an opening formed through a center of the board. This board on chip package may be structurally vulnerable to a variety of forces, thereby providing a variety of reliability issues. The reliability issues may become more severe as processes of manufacturing the IC chip become more divided and involved.

Figure 1:
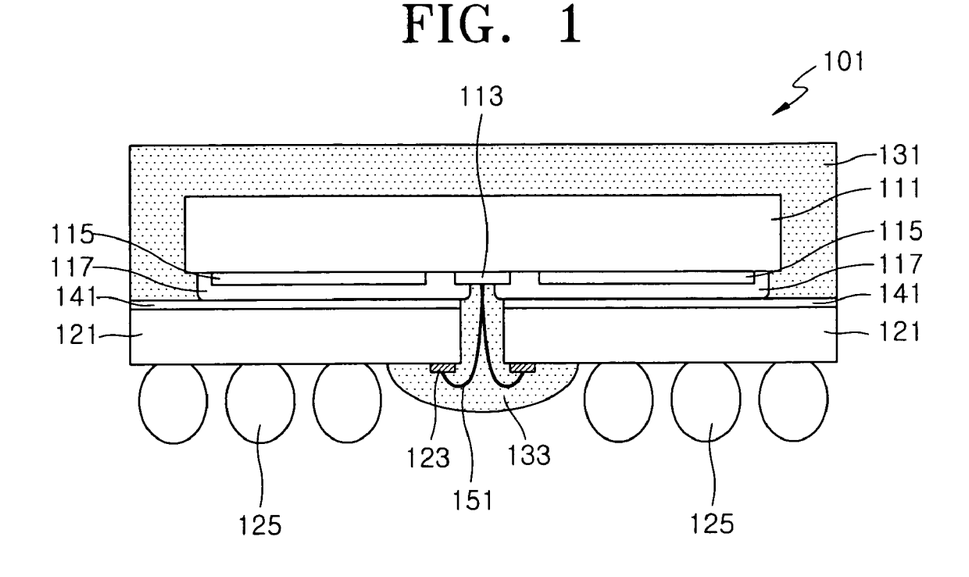
FIG. 1 is a sectional view of a conventional ball grid array type board on chip package.

FIG. 1 is a sectional view of a conventional ball grid array type board on chip package. Referring to FIG. 1, the board on chip package 101 may include an IC chip 111, a board 121 may be mounted on the IC chip 111 and a molding resin layer 131 may cover the IC chip 111.

A plurality of contact pads 113 (only one is shown) and a plurality of metal lines 115 may be formed on the IC chip 111. The contact pad 113 may be formed on a center of the IC chip 111. The metal lines 115 may be covered by an insulation layer 117.

The board 121 may support a plurality of solder balls 125 and a plurality of electrode pads 123. The electrode pads 123 may be electrically connected to the solder balls 125.

The board and the IC chip 111 may be adhered to each other by an adhesive material 141.

The contact pads 113 and the electrode pads 123 may be electrically interconnected by boding wires 151. The IC chip 111 may electrically interface an external device (not shown) through the bonding wires 151 and the solder balls 125.

The IC chip 111 and the bonding wires 151 may be molded by molding resin 131 and 133 to be protected from external environment.

According to the conventional board on chip package 101, the contact pad 113 may be disposed between the IC chip 111 and the board 121. The IC chip 111 may support the contact pad 113, which may be fabricated metal, and the insulation layer 117, which may fabricated from an insulating material. The IC chip 111 may be molded by the molding resin 131. Due to the mismatch between the different materials and stresses between the IC chip 111 and the board 121, stresses may be concentrated around the contact pad 113. As a result, delamination may be generated between the contact pad 113 and the insulation layer 117. Because the plurality of the contact pads 113 may be concentrated on the center of the IC chip 111, a metal region may occupy more than 60%. As a result, the delamination may be generated between the contact pads 113 and the insulation layer 117 even by a relatively small amount of the stress. Due to the delamination, the reliability of the board on chip package may be deteriorated. delamination may cause the board on chip package 101 to be defective. In an attempt to reduce the delamination phenomenon, numerous and alternative metal line designs and/or metal line processes may have been implemented and various improvements may have been made to the metal line material, the molding resin and the adhesive materials. However, these propositions and improvement may not have sufficiently addressed the delamination problem.

SUMMARY

According to an example, non-limiting embodiment, a board on chip package may include an integrated circuit chip having an active surface supporting a plurality of contact pads. An interposer may be adhered to the active surface of the integrated circuit chip. The interposer may be provided with at least one hole through which the contact pads are exposed. A board may have a first surface supporting a plurality of conductive lines and a second surface adhered to the interposer. The board may be provided with an opening through which the contact pads are exposed. A plurality of bonding wires may connect the contact pads to the conductive lines through the opening.

According to another example, non-limiting embodiment, a method of manufacturing a package may involve providing a wafer having a surface on which a plurality of integrated circuit chips are provided. An interposer may be adhered to the surface of the wafer. The wafer may be cut to separate the integrated circuit chips. A board may be adhered to the interposer on each integrated circuit chip. The boards may be bonded to the integrated circuit chips using bonding wires.

BRIEF DESCRIPTION OF THE DRAWINGS

Example, non-limiting embodiments of the present invention will be described with reference to the attached drawings.

The drawings are provided for illustrative purposes only and are not drawn to scale. The spatial relationships and relative sizing of the elements illustrated in the various embodiments may be reduced, expanded and/or rearranged to improve the clarity of the figure with respect to the corresponding description. The figures, therefore, should not be interpreted as accurately reflecting the relative sizing or positioning of the corresponding structural elements that could be encompassed by an actual device manufactured according to example embodiments of the invention.

DETAILED DESCRIPTION OF EXAMPLE EMBODIMENTS

Example, non-limiting embodiments of the present invention will be described with reference to the accompanying drawings. This invention may, however, be embodied in many different forms and should not be construed as limited to example embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention.

Well-known structures and processes are not described or illustrated in detail to avoid obscuring the present invention.

An element is considered as being mounted (or provided) "on" another element when mounted or provided) either directly on the referenced element or mounted (or provided) on other elements overlaying the referenced element. Throughout this disclosure, spatial terms such as "upper," "lower," "above" and "below" (for example) are used for convenience in describing various elements or portions or regions of the elements as shown in the figures. These terms do not, however, require that the structure be maintained in any particular orientation. Example, non-limiting embodiments of the present invention will be described with reference to the accompanying drawings, in which example embodiments of the invention are shown. Like reference numerals in the drawings denote like elements, and thus their description will be omitted.

Figure 2:
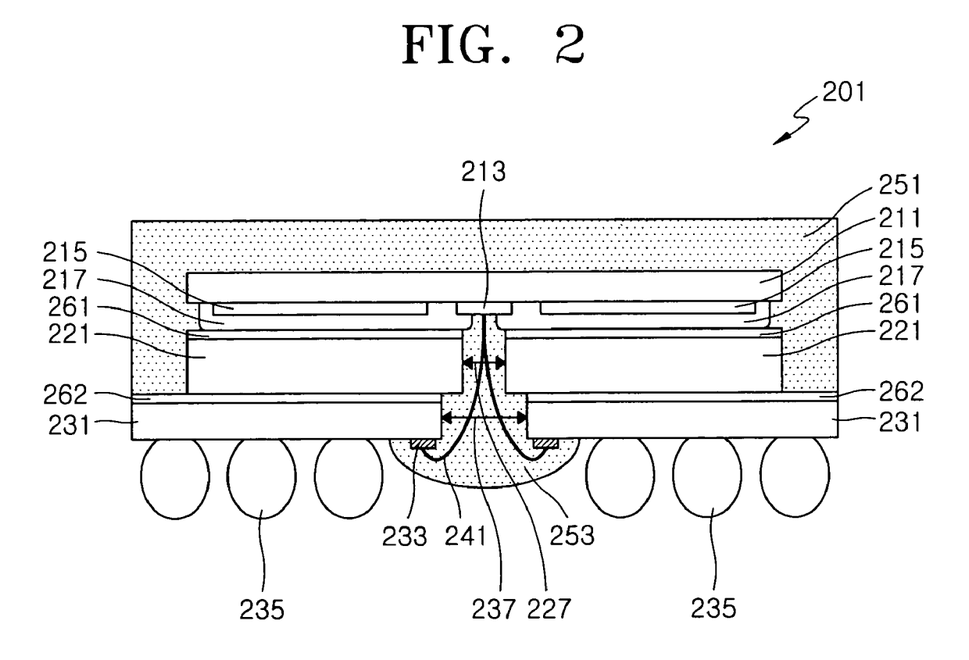
FIG. 2 is a sectional view of a ball grid array type board on chip package according to an example, non-limiting embodiment of the present invention.

FIG. 2 is a sectional view of a ball grid array type board on chip package according to an embodiment of the present invention. Referring to FIG. 2, a board on chip package 201 may include an integrated circuit (IC) chip 211, an interposer 221 and a board 231 that may be assembled together in a stack.

Contact pads 213 (only one is shown), metal lines 215 and an insulation layer 217 may be provided on an active surface of the IC chip 211. By way of example only, the contact pad 213 may be provided on a center portion of the active surface of the IC chip 211. The metal lines 215 may electrically connect the contact pad 213 to a semiconductor element (not shown) of the IC chip 211. The insulation layer 217 may cover the active surface of the IC chip 211, the metal lines 215 and portions of the contact pads 213. The insulation layer 217 may protect the metal lines 215 and the semiconductor elements. A rear surface of the IC chip 211 may be ground to reduce a size of the board on chip package 201.

Figure 3:
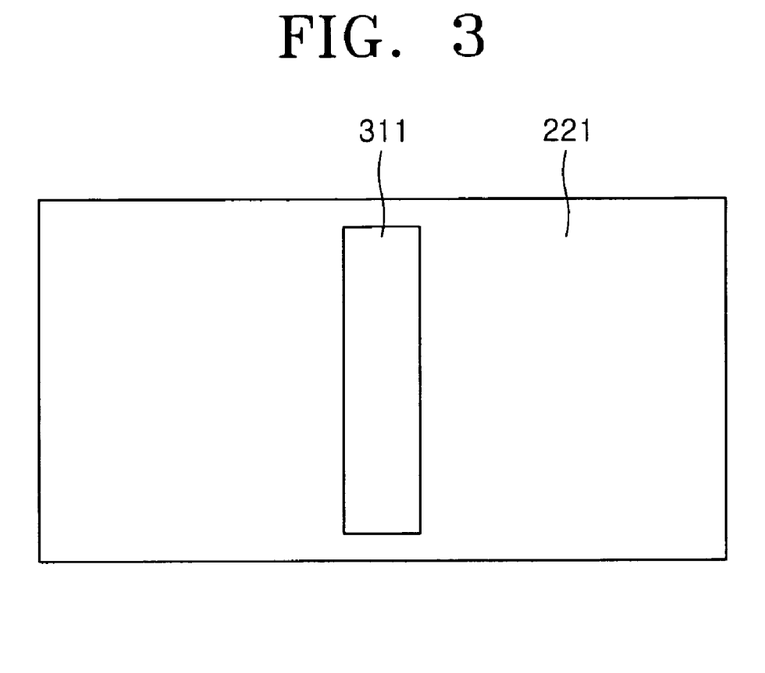
FIG. 3 is a schematic view of an example interposer that may be implemented in the package illustrated in FIG. 2.
Figure 4:
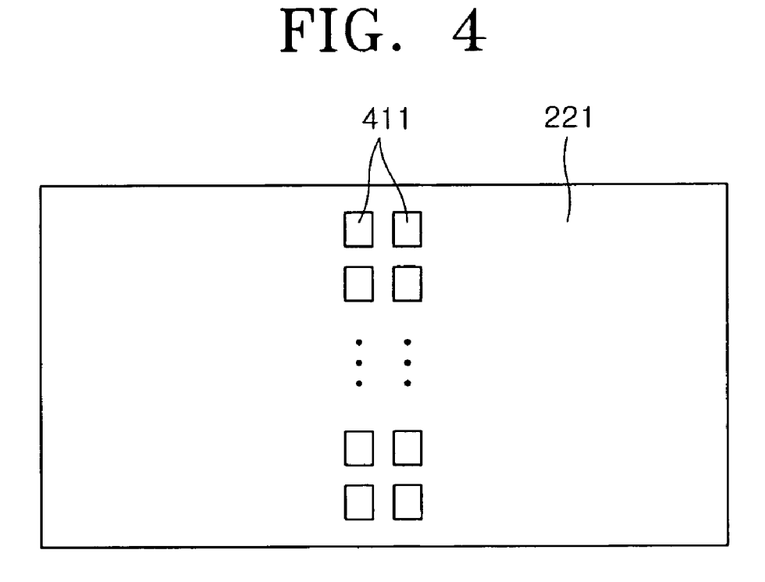
FIG. 4 is a schematic view of another example interposer that may be implemented in the package illustrated in FIG. 2.

The interposer 221 may be adhered to the active surface of the IC chip 211 by the insulation layer 217 and/or an adhesive 261. When the interposer 221 is adhered to the IC chip 211 by the insulation layer 217, the insulation layer 217 may be fabricated from an adhesive material such as photosensitive polyimide and/or poly benzo oxazole, for example. A hole 227 may be provided through the interposer 221. The contact pad 213 may be exposed through the hole 227. As shown in FIG. 3, a single hole 311 may be provided through the interposer 221, or as shown in FIG. 4, a plurality of holes 411 may be provided through the interposer 221. The hole(s) provided through the interposer 221 may be of any geometric shape. In any cases, the contact pad 213 may be exposed through the holes provided in the interposer 221.

The interposer 221 may be fabricated from a material such as glass, metal, silicon, and ceramic, for example. When the interposer 221 is fabricated from metal, the ground performance of the IC chip 211 may be improved by the interposer 221 being connected to a ground terminal of the IC chip 211. Also, the ground performance of the board 231 may be improved by the interposer 221 being connected to a ground terminal of the board 231.

A plurality of metal lines (not shown), a plurality of electrode pads 233 and a plurality of conductive bumps 235 may be provided on a surface of the board 231. The metal lines may electrically connect the electrode pads 233 to the conductive bumps 235. An opening 237 may be provided through the board 231. By way of example only, the opening 237 may be located in the vicinity of the electrode pads 233. The contact pad 213 of the IC chip 211 may be exposed through the opening 237. Another surface of the board 231 may be adhered to the interposer 221 by an adhesive 262.

The adhesives 261, 262 may be a material such as photosensitive polyimide, poly benzo oxazole, acrylic-base material, and/or silicon-based material, for example. In addition, photosensitive material may be applied as the adhesives 261, 262.

Bonding wires 241 may connect the contact pad 213 of the IC chip 211 to the electrode pads 233 of the board 231 through the opening 237 of the board 231 and the hole 227 of the interposer 221.

The contact pad 213 of the IC chip 211, the hole 227 of the interposer 221, the opening 237 of the board 231, the bonding wires 241, and the electrode pads 233 of the board 231 may be molded by molding resin 253.

The IC chip 211, the interposer 221 and the board 231 may be molded by molding resin 251.

By inserting the interposer 221 between the IC chip and the board 231, stresses generated around the contact pad 213 of the IC chip 211 may be transmitted to the interposer 221. The interposer 221 may absorb the stresses generated in the IC chip 211. Therefore, an active surface of the IC chip 211, which may be vulnerable to the stresses may be protected. This may reduce the likelihood of delamination between the contact pad 213 and the insulation layer 217.

Figure 5:
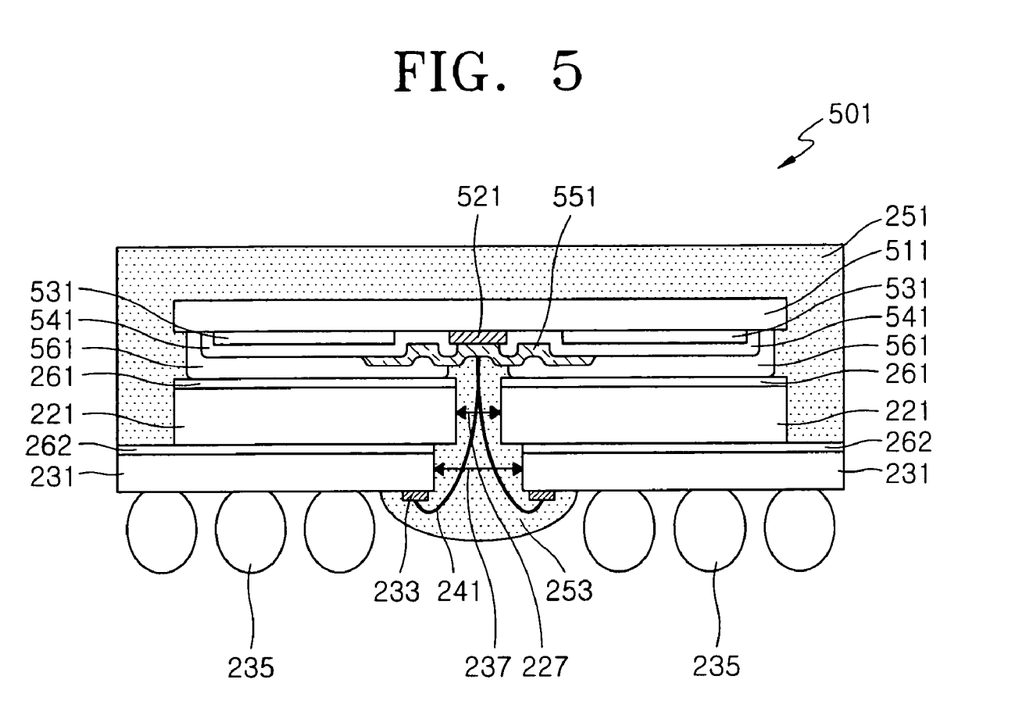
FIG. 5 is a sectional view of a ball grid array type board on chip according to another example, non-limiting embodiment of the present invention.

FIG. 5 is a sectional view of a ball grid array type board on chip according to another embodiment of the present invention. Referring to FIG. 5, the board on chip package 501 may include an IC chip 511, an interposer 221 and a board 231 that may be assembled together in a stacked. The board on chip package 501 of this embodiment may be similar to that depicted in FIG. 2, except for a structure of the IC chip 511.

The IC chip 511 may include an electrode pad 521 and a plurality of metal lines 531. A first insulating interlayer 541 may be provided on an active surface of the IC chip 511 to cover portions of the electrode pad 521 and the metal lines 531. A contact pad 551, which may contact the electrode pad 521, may be provided on the first insulating interlayer 541. A second insulating interlayer 561 may cover a part of the contact pad 551 and the first insulating interlayer 541. The contact pad 551 of the IC chip 511 a rewiring feature. The remetal line technology may be realized using a wafer level integration technology, for example.

The contact pad 551 may be electrically connected to a semiconductor element (not shown) of the IC chip 511 through the electrode pad 521.

A rear surface of the IC chip 511 may be ground to reduce the size of the board on chip package 501.

The IC chip 511 and the interposer 221 may be adhered to each other by the second insulating interlayer 561. Here, the second insulating interlayer 561 may be fabricated from a material such as photosensitive polyimide, and/or poly benzo oxazole, for example. Alternatively, the IC chip 511 and the interposer 221 may be adhered to each other by an adhesive material 261.

By inserting the interposer 221 between the IC chip 511 and the board 231, the stresses generated around the contact pad 551 of the IC chip 511 may be transmitted to the interposer 221. Therefore, the delamination between the contact pad 551 and the second insulating interlayer 561 may be effectively reduced. The delamination preventing effect may be increased when the IC chip 511 includes a rewiring feature as illustrated in FIG. 5.

FIGS. 6A through 6G are sectional views of example processes that may be implemented to manufacture a board on chip package according to an example embodiment of the present invention. The method will be described with reference to FIGS. 2 through 5 as well as FIGS. 6A through 6G.

Figure 6A:
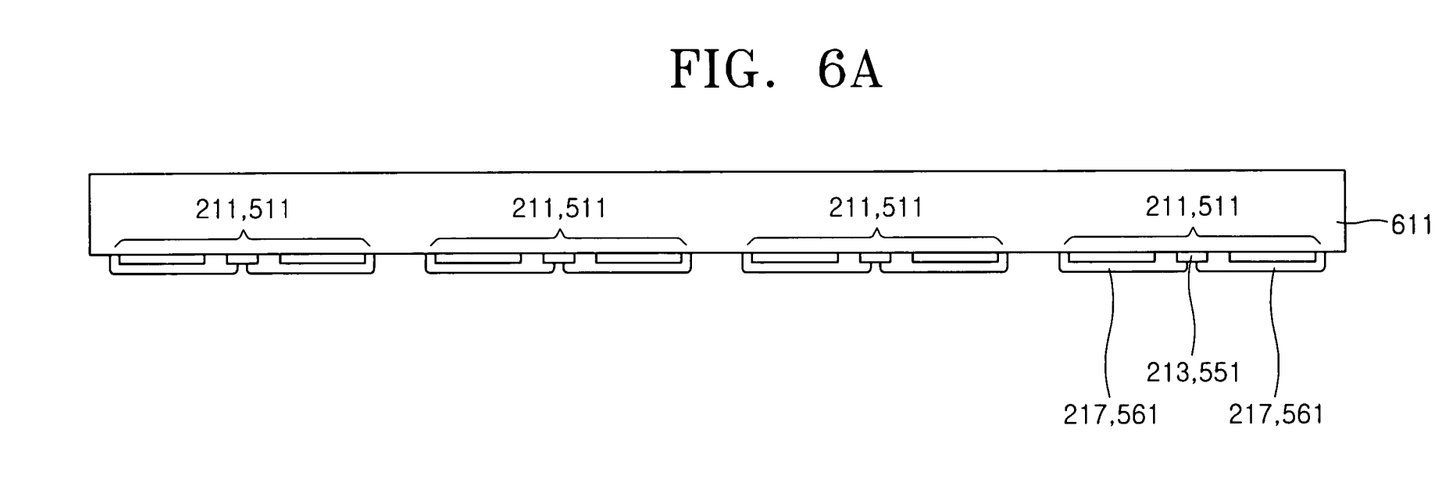
FIGS. 6A through 6G are sectional views of processes that may be implemented to manufacture a board on chip package according to an example, non-limiting embodiment of the present invention.

Referring first to FIG. 6A, a wafer 611 having a plurality of IC chips 211 or 511 may be provided. Contact pads 213 or 551 may be provided on each IC chip 211 or 511. The IC chips may have a structure as illustrated in FIG. 2 and/or a structure as illustrated in FIG. 5.

Figure 6B:
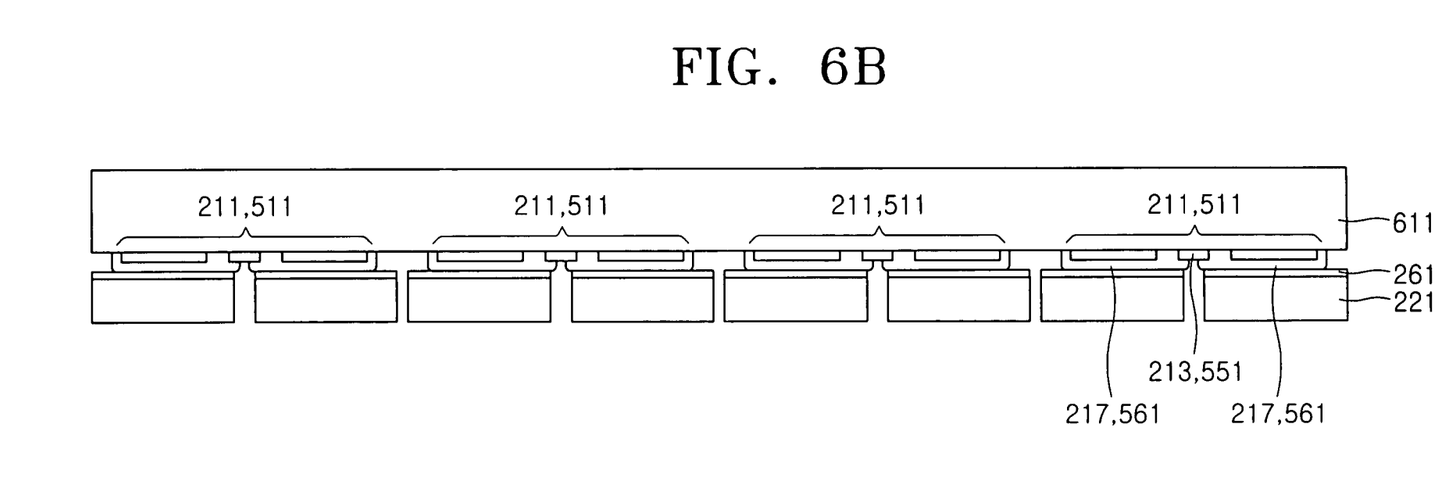

Referring to FIG. 6B, the interposer 221 may be adhered to the wafer 611. By way of example only, the interposer 221 may have a size identical to that of the wafer 611. The interposer 221 may be adhered to the wafer 611 by the adhesive material 261 or the insulation layer 217 or 561, which may be provided on the active surface of the wafer 611. If the interposer 221 is adhered to the wafer 611 by the insulation layer 217 or 561, then the insulation layer 217 or 561 may be fabricated from adhesive material. The interposer 221 may be fabricated from at least one of metal and insulating material.

Figure 6C:
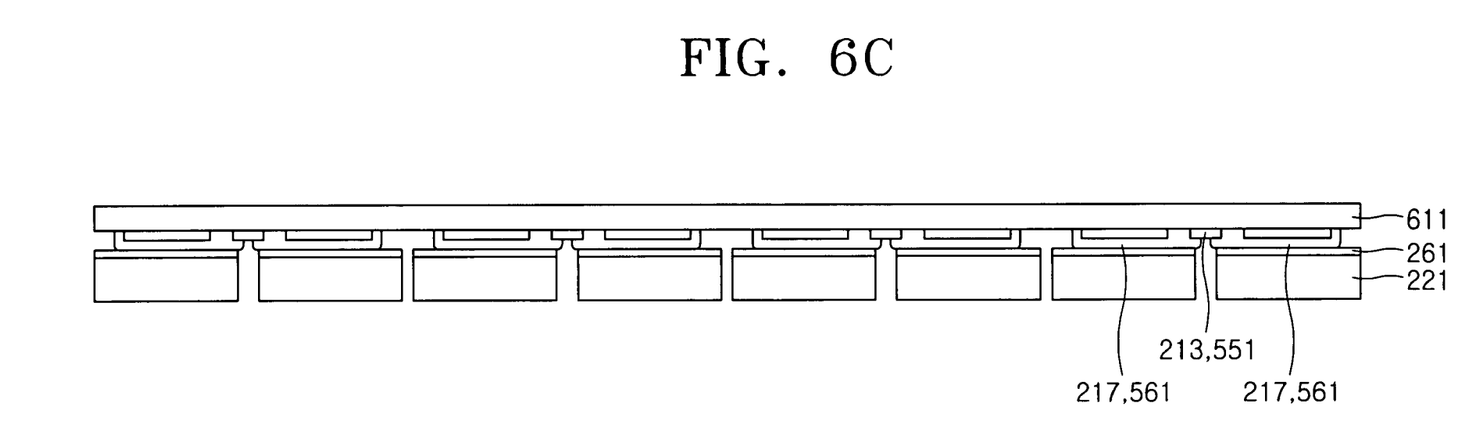

Referring to 6C, a rear surface of the wafer 611 may be ground to reduce a thickness of the wafer 611. The thickness of the wafer 611 may be within a range allowed by a specification. A remaining portion of the wafer 611 may protect an active surface of the wafer 611.

Figure 6D:
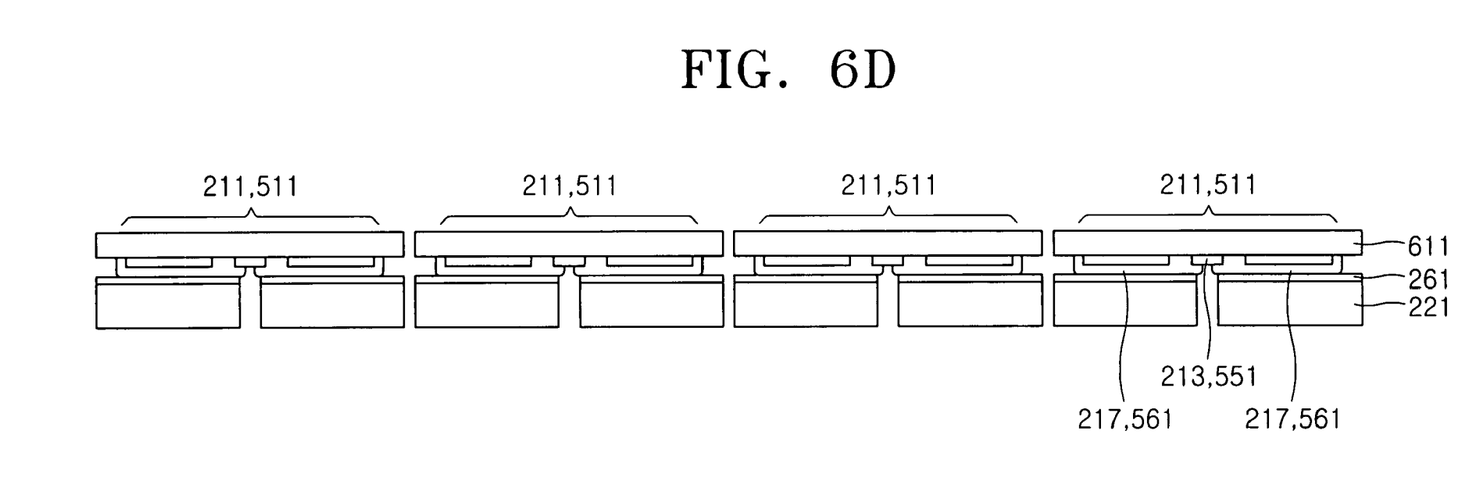

Referring to FIG. 6D, the wafer (611 of FIG. 6C) may be cut into a plurality of IC chips 211 or 511. When the wafer 611 is cut, the interposer (221 of FIG. 6C) may be cut together with the wafer 611.

Figure 6E:
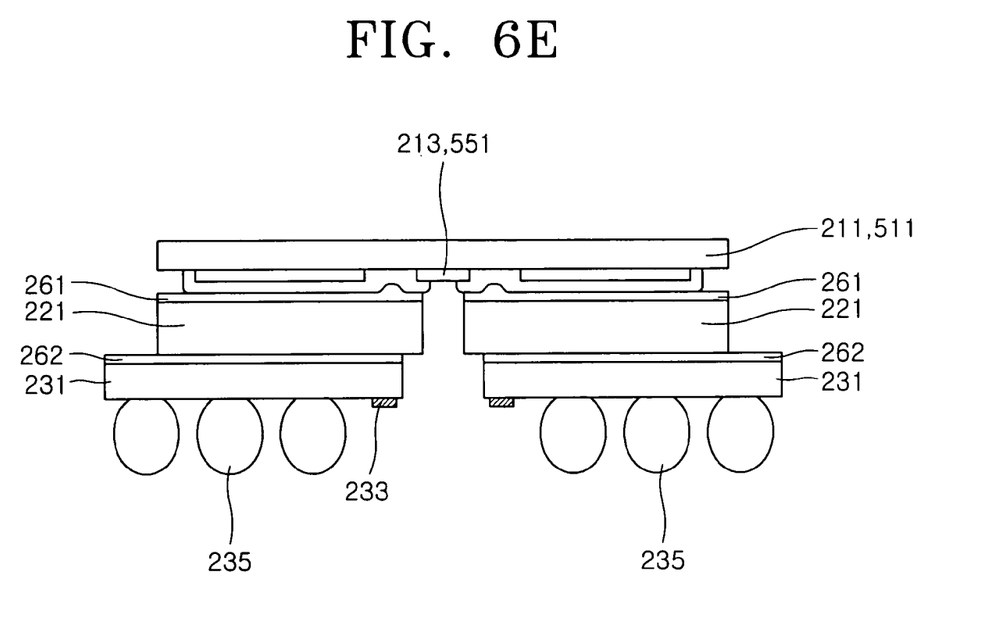

Referring to 6E, the interposer 221 may be adhered to a first surface of the board 231 by the adhesive material 262. A second surface of the board 231 may support the plurality of conductive bumps 235, the electrode pads 233 and the metal lines (not shown), which may connect the conductive bumps 235 to the electrode pads 233.

Figure 6F:
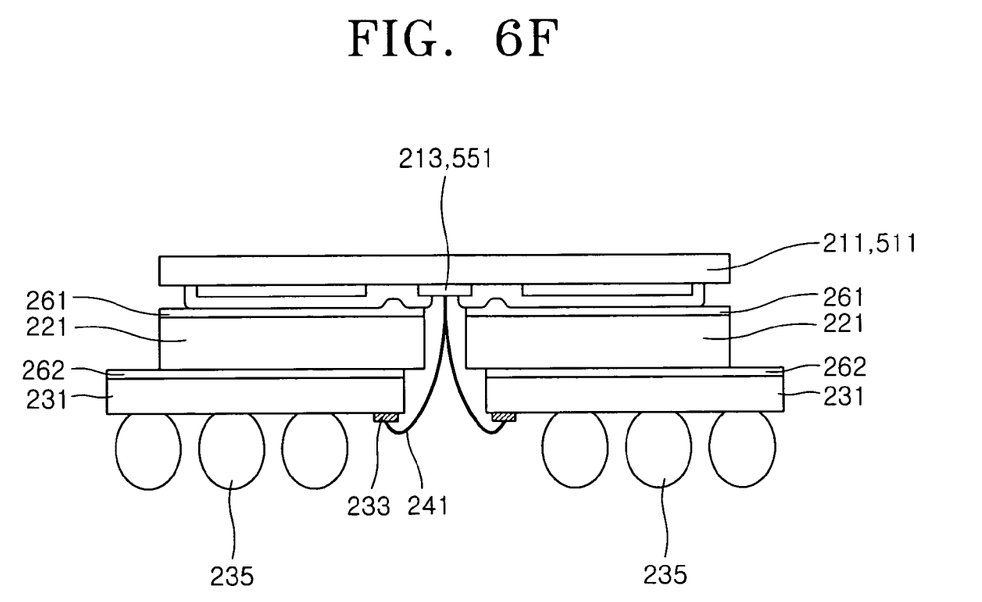

Referring to FIG. 6F, the electrode pads 233 of the board 231 may be bonded to the contact pads 213 or 551 by the bonding wires 241.

Figure 6G:
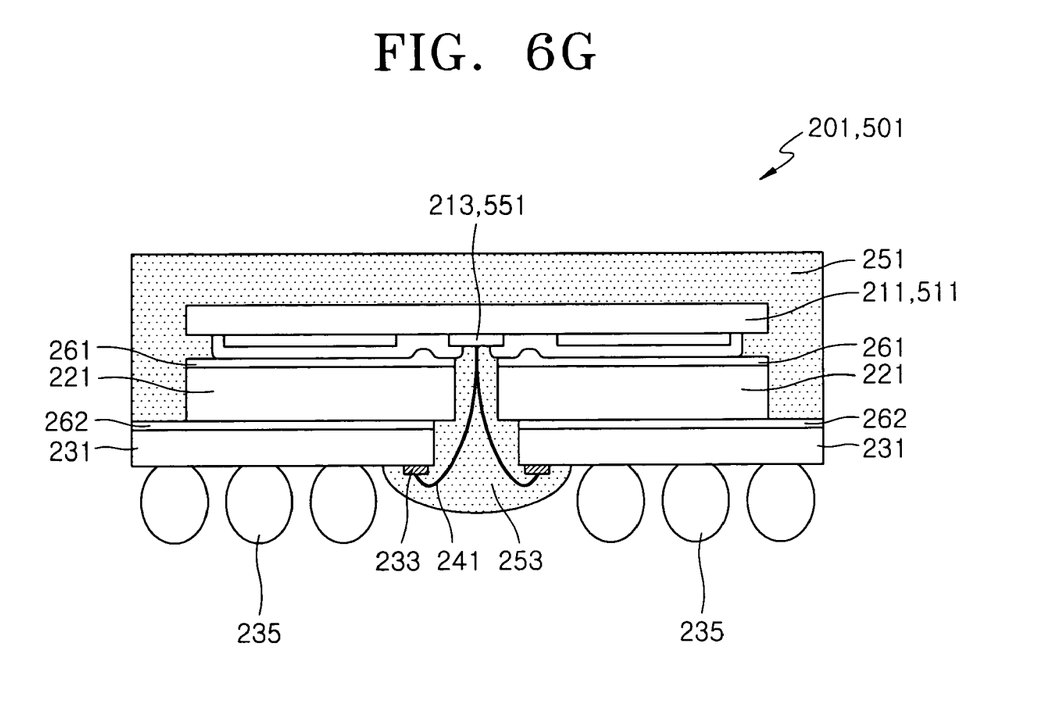

Referring to FIG. 6G, the front and rear surfaces of the board on chip package 201 or 501 may be molded. For example, a portion of the front surface of the board on chip package 201 or 501, which may be bonded by the bonding wires 241, may be molded by the molding resin 253. The IC chips 211 or 511 and the interposer 221 may molded by the molding resin 251. Epoxy molding compound (for example) may be used as the molding resin. In alternative embodiments, the molding of the IC chips 211 or 511 and the interposer 221 may be omitted.

The example embodiments may be implemented as ball grid array type board on chip package 201 or 501. Alternative embodiments may implement other gall grid array types such as flip chip ball grid array (FC-BGA), tape ball grid array (TBGA) and fine-pitch ball grid array (FBGA). Alternative embodiments may also be applied to packages such as a flip chip, a wafer level package, and a wafer level stack package to which the wire bonding method may not be applied.

By inserting the interposer 221 between the IC chip 211 or 511 and the board 231, stresses may be transmitted to the interposer 221. Therefore, the delamination between the IC chip 221 or 511, the contact pad 213 or 551 and the insulation layer 217 or 561 may be reduced. As a result, the reliability of the board on chip package 201 and 501 may be improved and the defects that may be caused by the delamination may be reduced.

Furthermore, by connecting the interposer 221 to the ground terminal of the IC chip 211 or 511 or the board 231, the grounding performance of the IC chip 211 or 511 or the board 231 may be improved.

The present invention has been shown and described with reference to example, non-limiting embodiments. It will be understood by those of ordinary skill in the art that various changes in form and details may be suitably implemented without departing from the spirit and scope of the present invention as defined by the following claims.

What is claimed is:

1. A board on chip package comprising: an integrated circuit chip having an active surface supporting a plurality of contact pads; an interposer adhered to the active surface of the integrated circuit chip, the interposer being provided with at least one hole through which the contact pads are exposed; a board having a first surface supporting a plurality of conductive lines and a second surface adhered to the interposer, the board being provided with an opening through which the contact pads are exposed; and a plurality of bonding wires connecting the contact pads to the conductive lines through the opening.

2. The board on chip package of claim 1, further comprising a plurality of conductive bumps formed on the first surface of the board, the conductive bumps contacting the conductive lines.

3. The board on chip package of claim 1, further comprising a plurality of electrode pads provided on the first surface of the board and contacting the conductive lines, the electrode pads being connected to the contact pads by bonding wires.

4. The board on chip package of claim 3, wherein the electrode pads are provided adjacent to the opening.

5. The board on chip package of claim 1, wherein the contact pads, the at least one hole, the opening, and the bonding wires are molded by molding resin.

6. The board on chip package of claim 1, wherein the integrated circuit chip has a rear surface that is ground.

7. The board on chip package of claim 1, wherein the integrated circuit chip and the interposer are molded by molding resin.

8. The board on chip package of claim 1, wherein the integrated circuit chip and the interposer are adhered to each other by an adhesive material.

9. The board on chip package of claim 1, wherein the interposer and the board are adhered to each other by an adhesive material.

10. The board on chip package of claim 1, wherein an insulation layer is provided on the active surface of the integrated circuit chip to cover edges of the contact pads.

11. The board on chip package of claim 1, wherein the integrated circuit chip comprises: a plurality of electrode pads provided on the front surface of the integrated circuit chip; a first insulating interlayer provided on the active surface of the integrated circuit chip to cover edges of the electrode pads; the plurality of contact pads being provided on the first insulating interlayer and contacting the electrode pads; and a second insulating interlayer covering portions of the contact pads and the first insulating interlayer.

12. The board on chip package of claim 11, wherein the integrated circuit chip and the interposer are adhered to each other by the second insulating interlayer.

13. The board on chip package of claim 11 wherein the interposer is fabricated from one of metal and insulating material.

14. The board on chip package of claim 13, wherein the interposer is fabricated from metal and connected to a ground terminal of the integrated circuit chip.

15. The board on chip package of claim 13, wherein the interposer is fabricated from metal and connected to a ground terminal of the board.

* * * * *